United States Patent
Otsuka

[19]

[11] Patent Number: 5,949,142
[45] Date of Patent: Sep. 7, 1999

[54] CHIP SIZE PACKAGE AND METHOD OF MANUFACTURING THE SAME

[75] Inventor: Masashi Otsuka, Fujisawa, Japan

[73] Assignee: Kabushiki Kaisha Toshiba, Kawasaki, Japan

[21] Appl. No.: 09/047,941

[22] Filed: Mar. 26, 1998

[30] Foreign Application Priority Data

Mar. 27, 1997 [JP] Japan ..................................... 9-075352

[51] Int. Cl.⁶ ........................... H01L 23/48; H01L 23/52; H01L 29/40
[52] U.S. Cl. ........................ 257/737; 257/783; 257/789; 257/793; 257/703
[58] Field of Search .................................... 257/738, 737, 257/778, 783, 787–789, 793, 795, 693, 703, 705; 228/180.22; 438/613

[56] References Cited

U.S. PATENT DOCUMENTS

| | | | |
|---|---|---|---|
| 5,468,655 | 11/1995 | Greer | 257/738 |
| 5,610,442 | 3/1997 | Schneider et al. | 257/787 |
| 5,729,440 | 3/1998 | Jimarez et al. | 257/778 |
| 5,763,295 | 6/1998 | Tokumo et al. | 438/118 |
| 5,864,178 | 1/1999 | Yamada et al. | 257/737 |

*Primary Examiner*—Mahshid Saadat
*Assistant Examiner*—Jhihan B. Clark
*Attorney, Agent, or Firm*—Finnegan, Henderson, Farabow, Garrett & Dunner, L.L.P.

[57] ABSTRACT

A chip size package is constituted by a chip on which an integrated circuit is formed, and plated bumps are formed at terminal portions of the integrated circuit, a flexible two-layered printed-circuit board having interlevel conductive bumps for electrically connecting metal patterns formed on the two surfaces of the flexible board, and an anisotropic conductive film for electrically connecting the plated bumps arranged on the chip to the flexible two-layered printed-circuit board, and fixing the chip onto the flexible two-layered printed-circuit board. With these features, the chip size package is excellent in mass production without any sealing by potting and any setting/removing on/from a convey jig and the like for every product.

6 Claims, 5 Drawing Sheets

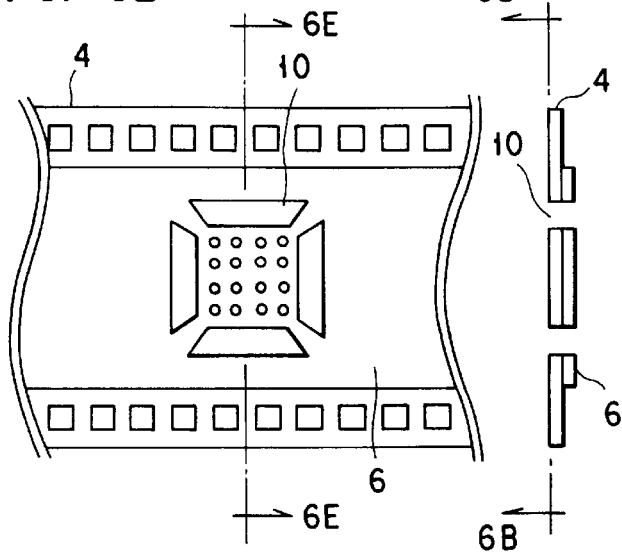
FIG. 6B
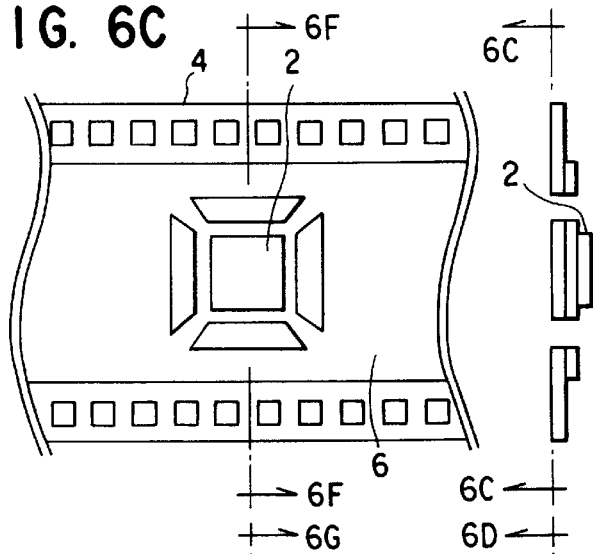
FIG. 6C
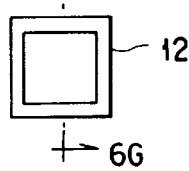
FIG. 6D
FIG. 6A

CHIP SIZE PACKAGE AND METHOD OF MANUFACTURING THE SAME

BACKGROUND OF THE INVENTION

The present invention relates to a chip size package and a method of manufacturing the same and, more particularly, to the package structure of a chip size package for portable information devices which must be mounted at high densities, and a method of manufacturing the same.

In recent years, compact information devices such as a PHS (Personal Handyphone System) and a PDA (Personal Digital Assistant) are actively being developed. Since these devices are very small, and their mounting spaces are limited, downsizing and an increase in density are also required for semiconductor packages to be used.

To meet these requirements, for example, a chip size package (to be referred to as a CSP hereinafter) mountable with almost the same size as that of a chip on which a semiconductor integrated circuit is formed is proposed. There are some types of conventional CSPs, and examples of the CSP will be described below.

FIG. 8 is a sectional view showing the first example of the conventional CSP structure. As shown in FIG. 8, a chip 100 is connected to a ceramic base 102 via plated bumps 101. Solder bumps 103 are formed at lower portions of the base 102. The connected portion by the plated bumps 101 is sealed by a potting agent 104 or the like.

FIG. 9 is a sectional view showing the second example of the conventional CSP structure. As shown in FIG. 9, a chip 110 is connected to a ceramic base 113 via stud bumps 111 made of, e.g., gold and a conductive paste 112 for fixing the stud bumps 111. Similar to the first example, solder bumps 114 are formed at lower portions of the base 113. The connected portion by the stud bumps 111 and the conductive paste 112 is sealed by a potting agent 115 or the like. The second example is different from the first example in that the chip and the base are connected via the plated bumps 101 in the first example, whereas they are connected via the stud bumps 111 and the conductive paste 112 in the second example.

FIG. 10 is a sectional view showing the third example of the conventional CSP structure. As shown in FIG. 10, a chip 120 is connected to inner leads 123 of a TAB (Tape Automated Bonding) tape 122 via plated bumps 121. Solder bumps 124 are formed at lower portions of the TAB tape 122. The connected portion by the plated bumps 121 and the inner leads 123 is sealed by a potting agent 125 or the like.

Each chip size package (CSP) described above however suffers some problem in terms of downsizing and manufacturing. In the first example, since a resin must be filled in the connected portion between the chip 100 and the base 102 by capillary action, sealing by potting must be performed every product, resulting in poor productivity. The base 102 used is generally made of ceramic. Since the ceramic becomes very hard upon calcination, processing such as cutting is difficult to perform in the assembly step. Therefore, the base 102 must be loaded to the assembly step in the form of a single piece, and the base 102 must be set/removed on/from a convey jig and the like, which further decreases the productivity.

In the second example, similar to the first example, sealing by potting must be performed for every product, and the base 113 must be set/removed on/from a convey jig and the like, resulting in poor productivity.

In the third example, the TAB tape 122 must be smaller in size than the chip 120, so the formation area for the solder bumps 124 is small. Even if the chip has the same number of pins as those in the first and second examples, the chip is difficult to mount because the pitch between the solder bumps 124 is smaller.

BRIEF SUMMARY OF THE INVENTION

The present invention has been made in consideration of the above problems, and has as its object to provide a chip size package (CSP) excellent in mass production without any sealing by potting and any setting/removing on/from a convey jig and the like every product, and a method of manufacturing the same.

To achieve the above object, according to the present invention, there is provided a chip size package comprising an IC chip on which a conductive bump is formed at a terminal portion of an integrated circuit, and a printed-circuit board having an interlevel conductive bump for electrically connecting conductive patterns formed on two surfaces via an insulating layer. The bonding means electrically connects the conductive bump arranged on the IC chip to the conductive pattern formed on the printed-circuit board, in addition bonds the IC chip to the printed-circuit board, and seals the bonded portion between the IC chip and the printed-circuit board.

According to the present invention, there is provided a method of manufacturing a chip size package, comprising the step of temporarily laminating an anisotropic conductive film in the form of one of a tape and a sheet prepared by dispersing conductive particles in a thermosetting resin, on a printed-circuit board in the form of one of a flexible tape and a sheet having an interlevel conductive bump for electrically connecting conductive patterns formed on two surfaces via an insulating layer.

According to the present invention, there is provided a method of manufacturing a chip size package, comprising the steps of temporarily laminating an anisotropic conductive film in the form of one of a tape and a sheet prepared by dispersing conductive particles in a thermosetting resin, on a printed-circuit board in the form of one of a flexible tape and a sheet having an interlevel conductive bump for electrically connecting conductive patterns formed on two surfaces via an insulating layer, and bonding an IC chip on which a conductive bump is formed at a terminal portion of an integrated circuit to the printed-circuit board temporarily laminated to the anisotropic conductive film.

According to the present invention, there is provided a method of manufacturing a chip size package, comprising the steps of temporarily laminating an anisotropic conductive film in the form of one of a tape and a sheet prepared by dispersing conductive particles in a thermosetting resin, on a printed-circuit board in the form of one of a flexible tape and a sheet having an interlevel conductive bump for electrically connecting conductive patterns formed on two surfaces via an insulating layer, forming a slit in the printed-circuit board temporarily laminated to the anisotropic conductive sheet, bonding an IC chip on which a conductive bump is formed at a terminal portion of an integrated circuit to the printed-circuit board temporarily laminated to the anisotropic conductive film, forming a solder ball for mounting on the conductive pattern of the printed-circuit board on a mounting surface side, and separating a bonded portion between the IC chip and the printed-circuit board from the printed-circuit board in the form of a tape.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6A is a flow chart showing the method of manufacturing the chip size package;

FIGS. 6B, 6C, and 6D are plan views each showing the state of the chip size package during the manufacturing process;

FIGS. 6E, 6F, and 6G are sectional views each showing the state of the chip size package during the manufacturing process;

DETAILED DESCRIPTION OF THE INVENTION

Embodiments of the present invention will be described below with reference to the several views of the accompanying drawing.

Figure 1:
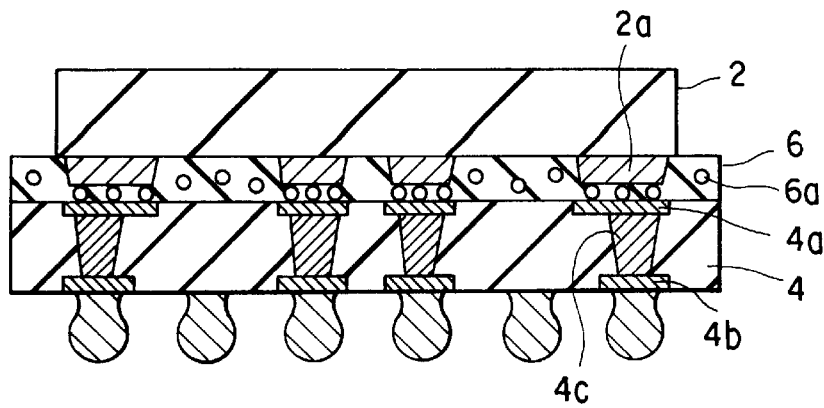
FIG. 1 is a sectional view showing the structure of a chip size package (CSP) according to the first embodiment of the present invention.
Figure 2:
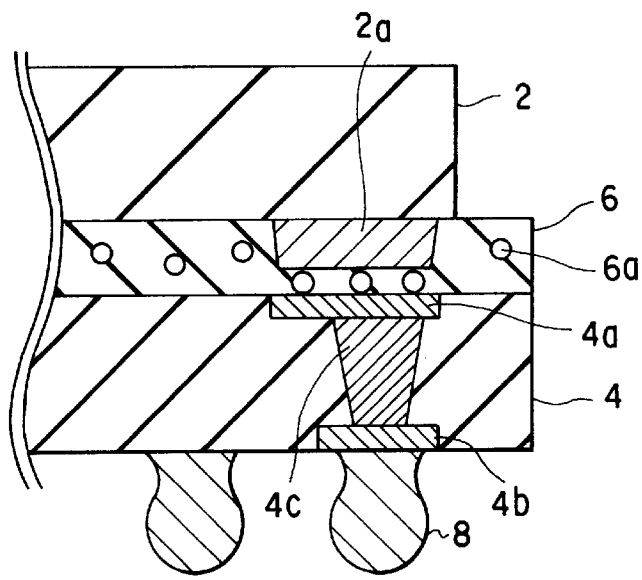
FIG. 2 is an enlarged sectional view showing the structure of the chip size package.

FIG. 1 is a sectional view showing the structure of a chip size package according to the first embodiment of the present invention. FIG. 2 is an enlarged sectional view showing the structure of the chip size package.

As shown in FIG. 1, the chip size package (CSP) is constituted by a chip 2 on which a semiconductor integrated circuit is formed, and conductive bumps 2a made of a metal are arranged at the electrode terminal portions of the semiconductor integrated circuit, a flexible two-layered printed-circuit board (to be referred to as a flexible board hereinafter) 4 having metal patterns 4a and 4b on the two surfaces and interlevel conductive bumps 4c for electrically connecting the metal patterns 4a and 4b, and an anisotropic conductive film 6 formed between the chip 2 and the flexible board 4 to bond the chip 2 and the flexible board 4.

The flexible board 4 is manufactured by the following method. That is, conductive bumps of a silver paste are printed in the form of projections on a metal film such as a copper film, and the silver paste is allowed to solidify. An insulating layer and metal film are overlayed on the silver paste, which extends through the insulating layer to connect the two metal films sandwiching the insulating layer. By using this method, the flexible two-layered circuit board 4 is manufactured.

The anisotropic conductive film (to be referred to as the ACF hereinafter) 6 is a sheet prepared by dispersing small conductive particles (conductive particles) 6a in a thermosetting resin, and the sheet thickness is about 50 $\mu$m. When the ACF 6 is vertically pressed and heated by conductors, the resin softens, and the conductive particles in the ACF 6 contact the upper and lower conductors to electrically connect them. The conductive particle is a metal ball about 5 $\mu$m in diameter. An example of this metal ball is an Ni or resin ball plated.

As shown in FIG. 2, the conductive bump 2a formed by plating on the chip 2 is connected to the metal pattern 4a on the flexible board 4 via the conductive particles 6a in the ACF 6. The metal pattern 4a is connected to the metal pattern 4b via the interlevel conductive bump 4c formed in the flexible board 4. On the metal pattern 4b, solder bumps 8 for mounting are formed.

At the same time when the conductive bump 2a of the chip 2 is electrically connected to the solder bump 8 formed on the flexible board 4, the bonded portion between the chip 2 and the flexible board 4 is sealed to increase the reliability and particularly humidity resistance of this chip size package.

The thickness of the chip 2 is about 450 $\mu$m, that of the ACF 6 at the bonded portion between the chip 2 and the flexible board 4 is about 32 $\mu$m, and that of the flexible board 4 is about 50 $\mu$m. Therefore, when this chip size package is attached to a mounting surface using the solder bumps 8, the height from the attachment surface (mounting surface) to the upper surface of the chip 2 can fall within the range of 1.2 mm or less. Note that the height from the surface of the chip 2 to the conductive bump 2a arranged on the chip 2 is about 14 $\mu$m.

As described above, according to the first embodiment, by using the anisotropic conductive film (ACF) for bonding of the chip 2 and the flexible board 4, a chip size package (CSP) can be realized without any sealing by potting every product.

Figure 3:
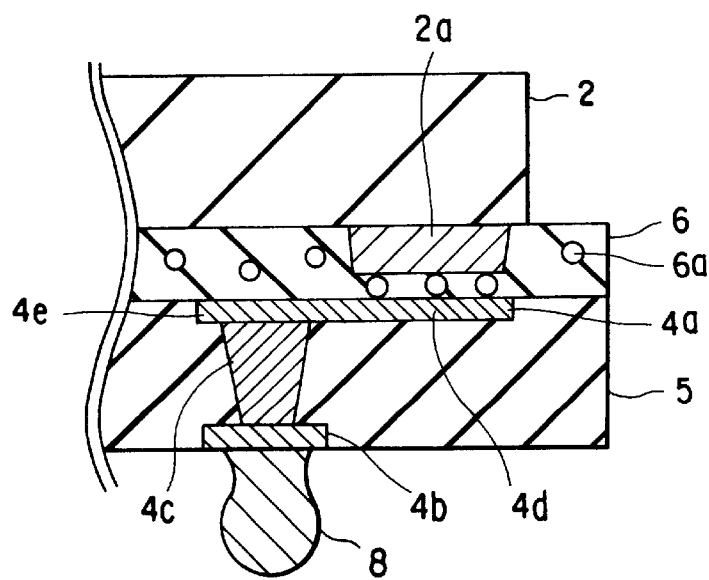
FIG. 3 is an enlarged sectional view showing the structure of a chip size package according to the second embodiment of the present invention.

A chip size package according to the second embodiment of the present invention will be described below. FIG. 3 is an enlarged sectional view showing the structure of a chip size package according to the second embodiment.

In the first embodiment shown in FIGS. 1 and 2, the interlevel conductive bump 4c, the metal pattern 4b, and the solder bump 8 of the flexible board 4 are formed immediately below the conductive bump 2a arranged on the chip 2. However, they need not always be immediately underneath the conductive bump 2a. In the second embodiment shown in FIG. 3, an interlevel conductive bump 4c, a metal pattern 4b, and a solder bump 8 of a flexible board 4 are arranged at positions spaced apart from the position of a conductive bump 2a.

As shown in FIG. 3, the chip size package (CSP) is constituted by a chip 2 on which a semiconductor integrated circuit is formed and the conductive bumps 2a made of a metal are arranged at the electrode terminal portions of the semiconductor integrated circuit, a flexible two-layered printed-circuit board (to be referred to as a flexible board hereinafter) 5 having a metal pattern 4a, wires 4d, and a metal pattern 4e on a bonding surface to the chip 2, a metal pattern 4b on a mounting surface, and the interlevel conductive bumps 4c for electrically connecting the metal patterns 4e and 4b, and an anisotropic conductive film 6 inserted between the chip 2 and the flexible board 5 to bond the chip 2 and the flexible board 5.

Figure 4:
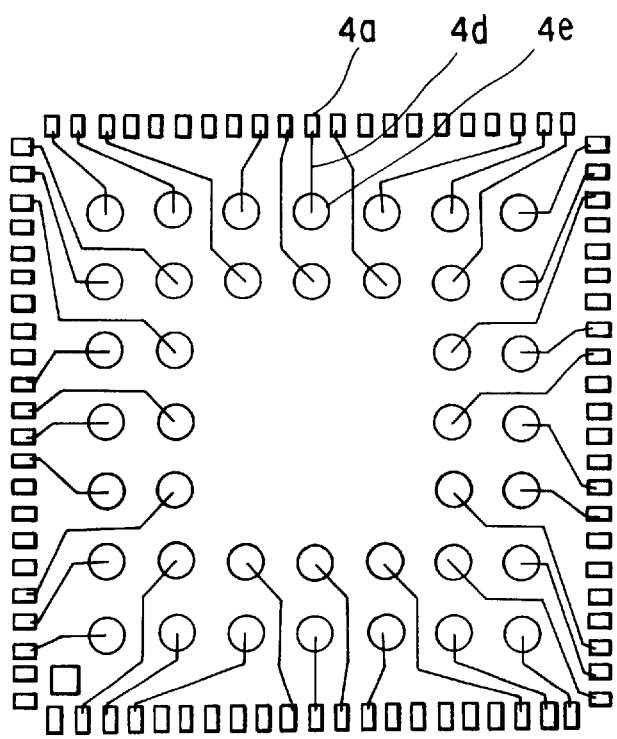
FIG. 4 is a view showing the layout of a metal pattern on the bonding surface of a flexible board in the chip size package.
Figure 5:
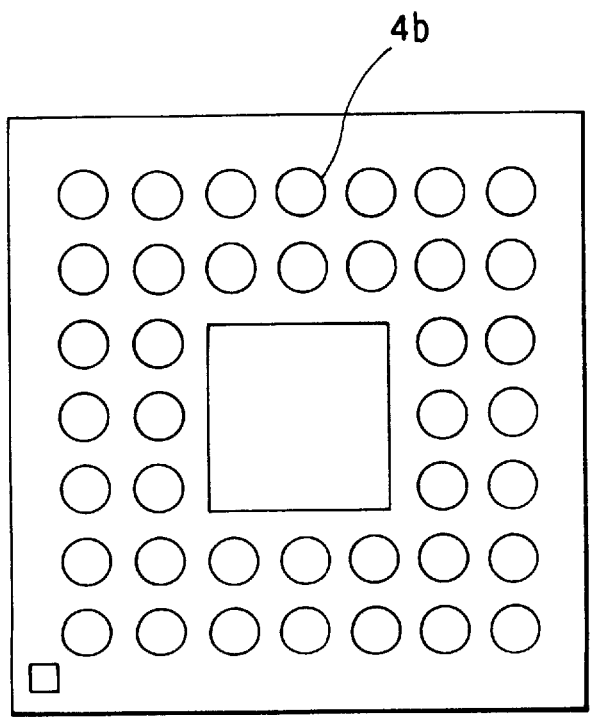
FIG. 5 is a view showing the layout of a metal pattern on the mounting surface of the flexible board.

FIG. 4 is a view showing the pattern layout of the metal pattern 4a, the wires 4d, and the metal pattern 4e of the flexible board 5 on the bonding surface to the chip 2. FIG. 5 is a view showing the pattern layout of the metal pattern 4b of the flexible board 5 on the mounting surface. On the flexible board 5, as shown in FIG. 4, the wires 4d are formed on the metal pattern 4a to be connected to the conductive bumps 2a, and the metal pattern 4e connected to the wires 4d is formed at a position where the solder bumps 8 are to be arranged. The metal pattern 4b is formed on the mounting surface corresponding to the metal pattern 4e, and the metal patterns 4e and 4b are connected via the interlevel conductive bumps 4c. The remaining arrangement is the same as that in the first embodiment shown in FIGS. 1 and 2.

As described above, according to the second embodiment, by using the anisotropic conductive film (ACF) for bonding of the chip 2 and the flexible board 5, a chip size package (CSP) can be realized without any sealing by potting every product. According to the second embodiment, the chip size package of the present invention can be formed using a chip manufactured for conventional wire bonding.

A method of manufacturing the chip size package (CSP) according to the first embodiment will be described below.

FIG. 6A is a flow chart of the method of manufacturing the chip size package (CSP). FIGS. 6B, 6C, and 6D are plan views each showing the state of the CSP during the manufacturing process. FIGS. 6E, 6F, and 6G are sectional views each showing the state of the CSP during the manufacturing process.

Simply stated, the flow of the manufacturing process is as follows. First of all, an anisotropic conductive film (ACF) 6 in the form of a tape or sheet is temporarily laminated on a flexible board 4 in the form of a tape or sheet (flexible board/ACF lamination step). Slits 10 are formed in the flexible board 4 (slit punching step; see FIGS. 6B and 6E). A chip 2 is bonded to the flexible board 4 on which the ACF 6 is laminated (chip bonding step; see FIGS. 6C and 6F). Solder bumps (mounting bumps) 8 are attached to the flexible board 4 (mounting ball attachment step), and the flexible board 4 is cut into CSPs 12 (single package cutting step; see FIGS. 6D and 6G).

The process of manufacturing the chip size package (CSP) according to the first embodiment will be explained in detail.

Figure 7A:
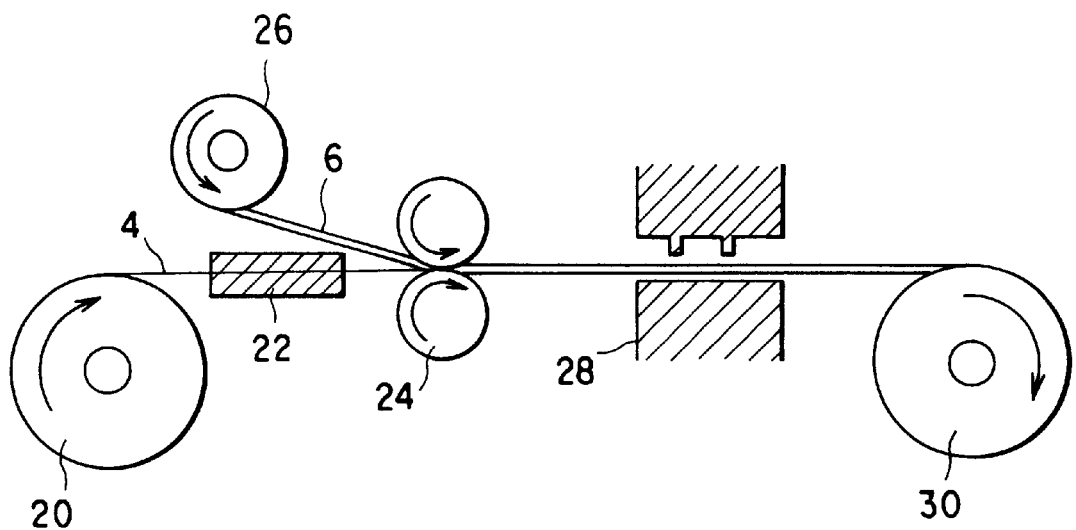
FIG. 7A is a view showing the anisotropic conductive film (ACF) lamination and slit formation steps in the process of manufacturing the chip size package.

FIG. 7A is a view showing the ACF lamination and slit formation steps as the steps of laminating the ACF 6 on the flexible board 4 and forming the slits 10.

The flexible board 4 in the form of a tape fed from a feed reel 20 is heated to about 90° C. by a preheating portion 22, and sent to lamination rollers 24. To the lamination rollers 24, the ACF 6 in the form of a tape is also fed from another feed reel 26. The lamination rollers 24 press the ACF 6 at 1 MPa to laminate the anisotropic conductive film (ACF) 6 on the flexible board 4.

The flexible board 4 on which the ACF 6 is laminated is sent to a slit punching portion 28. The slit punching portion 28 forms trapezoidal holes like ones shown in FIG. 6B, i.e., the slits 10 in portions of the flexible board 4 corresponding to the four sides of a CSP. The slits 10 facilitate cutting of the CSP from the flexible board 4 in the form of a tape in a subsequent step, i.e., cutting into CSPs 12. The flexible board 4 in which the slits 10 are formed is taken up by a takeup reel 30.

Figure 7B:
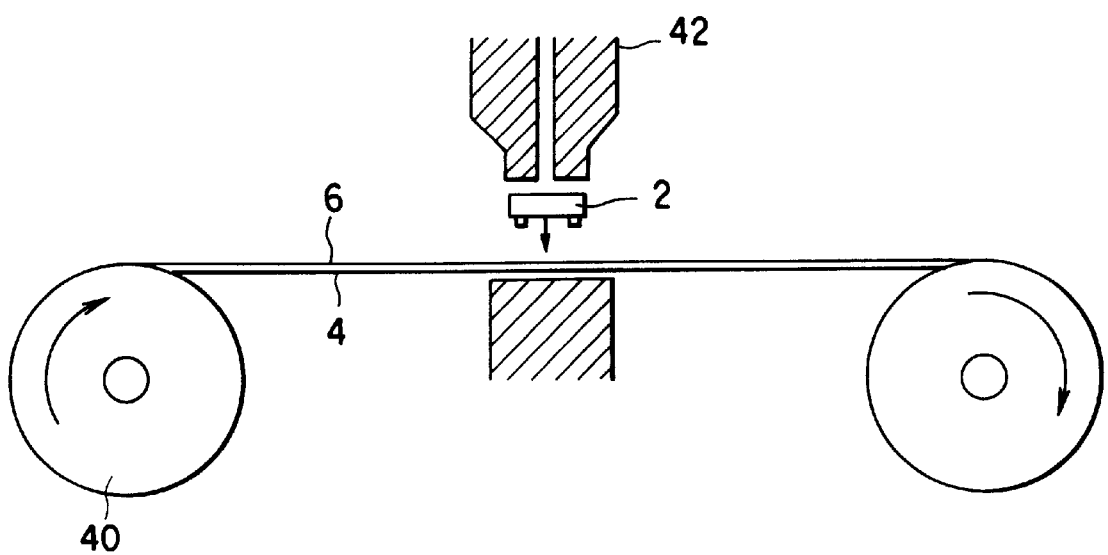
FIG. 7B is a view showing the chip bonding step in the process of manufacturing the chip size package.
Figure 8:
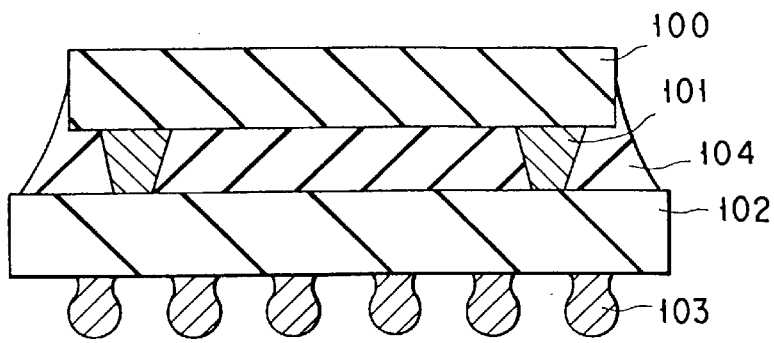
FIG. 8 is a sectional view showing the first example of a conventional CSP structure.
Figure 9:
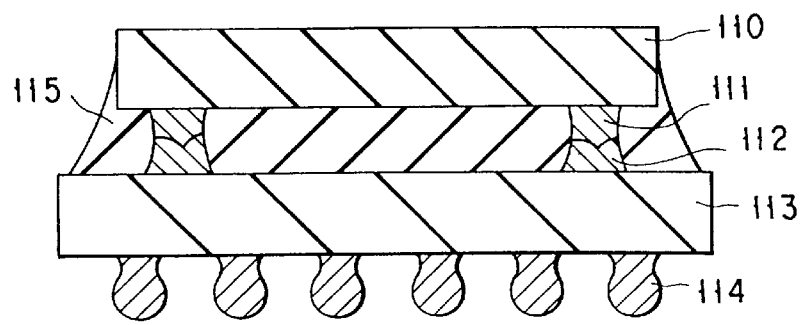
FIG. 9 is a sectional view showing the second example of the conventional CSP structure.
Figure 10:
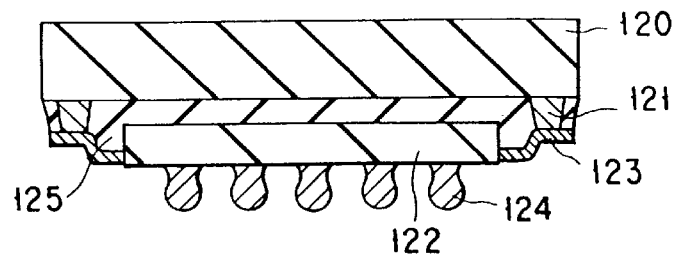
FIG. 10 is a sectional view showing the third example of the conventional CSP structure.

The steps of bonding the chip 2 to the flexible board 4 upon formation of the slits and cutting the flexible board 4 into CSPs 12 will be explained. FIG. 7B is a view showing the chip bonding step as the step of bonding the chip 2 to the flexible board 4.

The flexible board 4 in the form of a tape upon formation of the slits 10 is fed from a feed reel 40 (takeup reel 30) to a chip attaching portion 42. The chip attaching portion 42 attaches the chip 2 onto the anisotropic conductive film (ACF) 6 laminated on the flexible board 4. At this time, the ACF 6 is heated to almost 140 to 170° C., and pressed at 60 g/bump to electrically bond the metal pattern 4a on the flexible board 4 to the conductive bumps 2a of the chip 2 so as to agree with each other as a circuit. At the same time as this electrical bonding, the ACF 6 is hardened, and the bonded portion of the ACF is sealed by this hardening to increase the reliability and particularly the humidity resistance. The unit "g/bump" represents the pressure applied to one solder bump 8.

The solder bumps (mounting balls) 8 are formed on the metal pattern 4b on the lower surface of the flexible board 4 bonded to the chip 2 in the above step. The flexible board 4 is cut into CSPs 12. After that, each CSP 12 is subjected to various tests and shipped as a product.

The method of manufacturing the chip size package (CSP) according to the second embodiment is the same as the above-described manufacturing method shown in FIGS. 6A to 7B.

The flexible board 4 bonded to the chip 2 is bonded to a printed-circuit board or the like via the solder bumps 8 at around 220 to 240° C. Since the resin used for the anisotropic conductive film (ACF) 6 is thermosetting, it does not influence the bonded portion of the ACF upon softening.

In the first and second embodiments, the conductive bumps 2a are arranged on the chip 2 side, but may be arranged on the flexible board 4 or 5 side. The film used at the bonded portion between the chip 2 and the flexible board 4 or 5 is not limited to the anisotropic conductive film (ACF), and may be another film prepared by dispersing conductive particles in a resin. In the above-mentioned manufacturing method, although the flexible board 4 or 5 in which the slits 10 are formed is taken up by the takeup reel 30, it may be directly bonded to the chip 2 without being taken up.

The flexible board 4 or 5 and the ACF 6 are in the form of a tape, but may be in the form of a sheet, or either one of them is in the form of a sheet. In this case, a convey mechanism suited to the tape or sheet form is employed.

As has been described above, according to the first and second embodiments, by using the anisotropic conductive film (ACF) for bonding of the chip 2 and the flexible board 4 or 5, a chip size package (CSP) can be realized without any sealing by potting every product. Since the flexible board 4 or 5 in the form of a tape is used as a board bonded to the chip 2 in the manufacturing process, a chip size package which can be easily, efficiently manufactured without any setting/removing on/from a convey jig and the like for every product can be realized.

Since the anisotropic conductive film tape is laminated on a tape of the flexible board 4 or 5 before the step of bonding the chip 2, a method of manufacturing a chip size package without any sealing by potting and any setting/removing on/from a convey jig and the like for every product can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A chip size package, comprising:
   an IC chip on which a conductive bump is formed at a terminal portion of said IC chip;
   a printed-circuit board having an interlevel conductive bump for electrically connecting conductive patterns formed on two surfaces via an insulating layer; and
   an anisotropic conductive film in the form of a sheet prepared by dispersing conductive particles in a thermosetting resin for electrically connecting said conductive bump formed on said IC chip to said conductive pattern arranged on said printed-circuit board, for bonding said IC chip to said printed-circuit board, and for sealing a bonded portion between said IC chip and said printed-circuit board.

2. A package according to claim 1, characterized in that said printed-circuit board is a flexible printed-circuit board.

3. A package according to claim 1 or 2, characterized in that said interlevel conductive bump arranged on said printed-circuit board is laid out at a position corresponding to a position where said conductive bump of said IC chip is laid out with respect to a bonding surface between said IC chip and said printed-circuit board.

4. A package according to claim 1 or 2, characterized in that said interlevel conductive bump formed on said printed-circuit board is laid out at a position which does not correspond to a position where said conductive bump of said IC chip is laid out with respect to a bonding surface between said IC chip and said printed-circuit board.

5. A package according to claim 1 or 2, characterized in that said interlevel conductive bump arranged on said printed-circuit board is laid out at a position corresponding to a position where said conductive bump of said IC chip is laid out with respect to a bonding surface between said IC chip and said printed-circuit board.

6. A package according to claim 1 or 2, characterized in that said interlevel conductive bump formed on said printed-circuit board is laid out at a position which does not correspond to a position where said conductive bump of said IC chip is laid out with respect to a bonding surface between said IC chip and said printed-circuit board.

* * * * *